(12) United States Patent
McGowan et al.

(10) Patent No.: US 12,019,095 B2
(45) Date of Patent: Jun. 25, 2024

(54) HEAT EXCHANGER FOR THERMAL CONTROL OF HEAT PRODUCING DEVICES

(71) Applicant: Mikros Manufacturing, Inc., Claremont, NH (US)

(72) Inventors: Jesse D. McGowan, Claremont, NH (US); Lucas H. Rose, Claremont, NH (US); Timothy F. Ryan, Claremont, NH (US); Adam E. Sharp, Claremont, NH (US); Javier A. Valenzuela, Claremont, NH (US)

(73) Assignee: Mikros Manufacturing, Inc., Claremont, NH (US)

( * ) Notice: Subject to any disclaimer, the term of this patent is extended or adjusted under 35 U.S.C. 154(b) by 0 days.

(21) Appl. No.: 18/212,705

(22) Filed: Jun. 21, 2023

(65) Prior Publication Data

US 2023/0408545 A1 Dec. 21, 2023

Related U.S. Application Data

(60) Provisional application No. 63/354,203, filed on Jun. 21, 2022.

(51) Int. Cl.
*G01R 1/04* (2006.01)
*H01L 21/66* (2006.01)
*H01L 21/687* (2006.01)

(52) U.S. Cl.
CPC ...... *G01R 1/0458* (2013.01); *H01L 21/68714* (2013.01); *H01L 22/30* (2013.01)

(58) Field of Classification Search
CPC ............ G01R 31/2831; G01R 31/2874; G01R 31/2877
See application file for complete search history.

(56) References Cited

U.S. PATENT DOCUMENTS

| | | | |
|---|---|---|---|
| 2003/0155939 A1* | 8/2003 | Lutz | G01R 31/2865 324/750.09 |
| 2005/0151553 A1* | 7/2005 | Kabbani | G01R 31/2891 324/750.08 |

* cited by examiner

*Primary Examiner* — Tung X Nguyen
(74) *Attorney, Agent, or Firm* — Jodi Ann McLane

(57) ABSTRACT

The present disclosure relates to a heat exchanger for thermal control of heat producing devices. In accordance with aspects and embodiments, this is achieved in the present design by placing a parallel flow path near the heat sink in the test head with a variable restriction in each flow path. The restrictions may be operated in a complementary manner to keep the fluid inertia in the main supply and return lines substantially constant. This arrangement results in a test head with higher cooling capacity and quicker response time than achievable with prior art semiconductor testing systems. The test head includes a pair of nested pneumatic actuators having non-circular pistons designed to provide Z axis motion and roll and tilt compliance. The pneumatic actuator assembly may be mounted on segmented flexures to provide X axis, Y axis and yaw compliance.

19 Claims, 11 Drawing Sheets

HEAT EXCHANGER FOR THERMAL CONTROL OF HEAT PRODUCING DEVICES

CROSS REFERENCE TO RELATED APPLICATIONS

The present application claims priority to Provisional Patent Application No. 63/354,203 entitled "Heat Exchanger for Thermal Control of Heat Producing Devices", filed on Jun. 21, 2022, the contents of which are incorporated herein by reference.

TECHNICAL FIELD

This disclosure relates generally to a device for maintaining thermal control of a device, more specifically, a thermal head assembly for regulation of temperature during CPU testing.

BACKGROUND OF THE INVENTION

Semiconductors generate a significant amount of heat during testing and require cooling. The use of heat exchangers for cooling of computer hardware is known in the art. Prior heater control methods predict element temperature from changes in electrical resistance.

US Patent Publication No. US20050151553 discloses a temperature control system, which includes a miniature liquid cooled heat sink, and is used to provide a controlled temperature surface to an electronic device, such as a semiconductor device, during the testing or burn in phase. In one embodiment, the system includes a miniature liquid cooled heat sink device having a monolithic counter flowing structure. In other embodiments, the system includes a heater, a flow control valve, a controller, and/or sensors.

U.S. Pat. No. 8,040,145 discloses a temperature control device that includes a miniature liquid cooled heat sink with integral heater and sensing elements used as part of a system to provide a controlled temperature surface to an electronic device, such as a semiconductor device, during the testing phase. The temperature control device includes an interface surface configured to provide a thermal path from the device to a device under test. One such device has a liquid cooled heat sink comprising a first heat transfer portion in a first plane and a second heat transfer portion in a second plane. The first and second heat transfer portions establish a three-dimensional cross flow of coolant within the heat sink structure. An alternative embodiment includes parallel fluid conduits, each having a three-dimensional microchannel structure that directs coolant flow in three dimensions within the fluid conduits. Coolant flow is in opposite directions through adjacent fluid conduits, thus resulting in three dimensional cross flow within the heat sink structure.

U.S. Pat. No. 5,280,422 discloses multiple heaters that are calibrated and controlled by a microcomputer, and a multiplexer of this system. The heaters are sequentially sampled and resistance calculated from voltage and current measurements. The operator enters a temperature for the calculated resistance to establish a calibrated resistance value. During run, the computer energizes and samples each heater to calculate its resistance. The calculated resistance is divided by the calibrated resistance to determine a resistance ratio. A look up table is stored in the computer having resistance ratios for corresponding temperatures. The computer compares the calculated ratio to that of the look up table to determine actual heater temperatures. Based upon heater temperatures, the computer controls energization of the heaters until set points are achieved.

U.S. Pat. No. 5,521,850 discloses multiple heaters that are calibrated and controlled by a micro computer, and a multiplexer for this system. The heaters are sequentially sampled and resistance calculated from voltage and current measurements. The operator enters a temperature for the calculated resistance to establish a calibrated resistance value. During run, the computer energizes and samples each heater to calculate its resistance. The calculated resistance is divided by the calibrated resistance to determine a resistance ratio. A look-up table is stored in the computer having resistance ratios for corresponding temperature. The computer compares the calculated ratio to that of the look-up table to determine actual heater temperatures. Based upon heater temperatures, the computer controls energization of the heaters until set points are achieved. Negative temperature coefficient and positive temperature coefficient transistors and semiconductors can be utilized.

U.S. Pat. No. 7,196,295 discloses a heater system that is provided with a layered heater in communication with a two wire controller, wherein a resistive layer of the layered heater is both a heater element and a temperature sensor. The two wire controller thus determines temperature of the layered heater using the resistance of the resistive layer and controls heater temperature through a power source. Furthermore, a heater system using a layered heater in communication with a two wire controller for a specific application of a hot runner nozzle in an injected molding system is also provided.

U.S. Pat. No. 10,934,921 discloses a method of predicting the temperature of a resistive heating element in a heating system. The method includes obtaining resistance characteristics of resistive heating elements and compensating for variations in the resistance characteristics over a temperature regime. The resistance characteristics of the resistive heating element include, but are not limited to, inaccuracies in resistance measurements due to strain induced resistance variations, variations in resistance due to the rate of cooling, shifts in power output due to exposure to temperature, resistance to temperature relationships, non-monotonic resistance to temperature relationships, system measurement errors, and combinations of resistance characteristics. The method includes interpreting and calibrating resistance characteristics based on a priori measurement and in situ measurements.

Presently, what is lacking in the prior art is a heat exchanger assembly having a very fast thermal response for controlling junction temperature of a semiconductor chip at desired test temperatures through testing cycles.

SUMMARY

Presently disclosed is an improved thermal control device for regulating the temperature of microchips during CPU testing. The disclosed improved device achieves a fast thermal response time during testing of a microchip.

The improved thermal control device places a heat sink directly against a Device under test (DUT), and between the DUT and heater. This improves cooling capacity by reducing the conduction path. The response speed relative to existing designs in the prior art is greater due to low thermal capacitance and high thermal conductivity of the heat sink utilized, and the low thermal capacitance of a thin film heater.

In one embodiment, a layer of plated and anodized aluminum is added between the heater and heat sink resulting in a joint that helps ensure electrical isolation with minimal thermal resistance. This joint allows for a very thin layer of thermally conductive epoxy to be used to attach the heater to the back side of the heat sink. The thin film heater may also be fabricated by etching copper traces on a thin PCB board. The change in electrical resistance of the heater is used to measure the heater trace temperature.

A chiller is fluidly connected to the heat sink. It is often desirable, as evidenced in the prior art, to place the heat sink at a distance away from the chiller. This makes rapid changes in flow rate difficult due to fluid inertia. It is desirable to achieve rapid changes in flow rate to maintain the DUT temperature at its set point as the DUT power is changed during testing. This is achieved in the present design by placing a parallel flow path near the heat sink with a variable restriction in each flow path. The restrictions may be operated in a complementary manner to keep the fluid inertia in the main supply and return lines substantially constant. This arrangement results in a test head with higher cooling capacity and quicker response time than achievable with prior art semiconductor testing systems.

In order to more effectively attach the test head to a DUT, a pair of nested pneumatic actuators having spherical pistons may be utilized to provide Z axis motion and roll and tilt compliance. The pneumatic actuator assembly may be mounted on segmented flexures to provide X axis, Y axis and yaw compliance. The improved mechanical actuator works to provide improved compliance in the X, Y and Z axis, and for roll, tilt and yaw while inhibiting rotation of the press plate and the temperature control unit.

BRIEF DESCRIPTION OF THE DRAWINGS

The foregoing features may be more fully understood from the following description of the drawings. Various aspects of at least one embodiment are discussed below with reference to the accompanying figures, which are not necessarily drawn to scale, emphasis instead being placed upon illustrating the principles disclosed herein. The drawings aid in explaining and understanding the disclosed technology. Since it is often impractical or impossible to illustrate and describe every possible embodiment, the provided figures depict one or more exemplary embodiments. The figures are incorporated in and constitute a part of this specification but are not intended as a definition of the limits of any embodiment.

Accordingly, the figures are not intended to limit the scope of the invention. Like numbers in the figures denote like elements. For purposes of clarity, not every component may be labeled in every figure.

DETAILED DESCRIPTION

The present disclosure will hereinafter be described with respect to one or more exemplary embodiments, with the understanding that the present disclosure is to be considered an exemplification and is not intended to limit the invention to the specific embodiments illustrated. It will be understood to one of skill in the art that the apparatus is capable of implementation in other embodiments and of being practiced or carried out in various ways. Also, the phraseology and terminology used herein is for the purpose of description and should not be regarded as limiting. Any references to examples, embodiments, components, elements or acts of the apparatus herein referred to in the singular may also embrace embodiments including a plurality, and any references in plural to any embodiment, component, element, or act herein may also embrace embodiments including only a singularity (or unitary structure). Likewise, unitary structures may be configured from multiple pieces. References in the singular or plural form are not intended to limit the presently disclosed apparatus, its components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
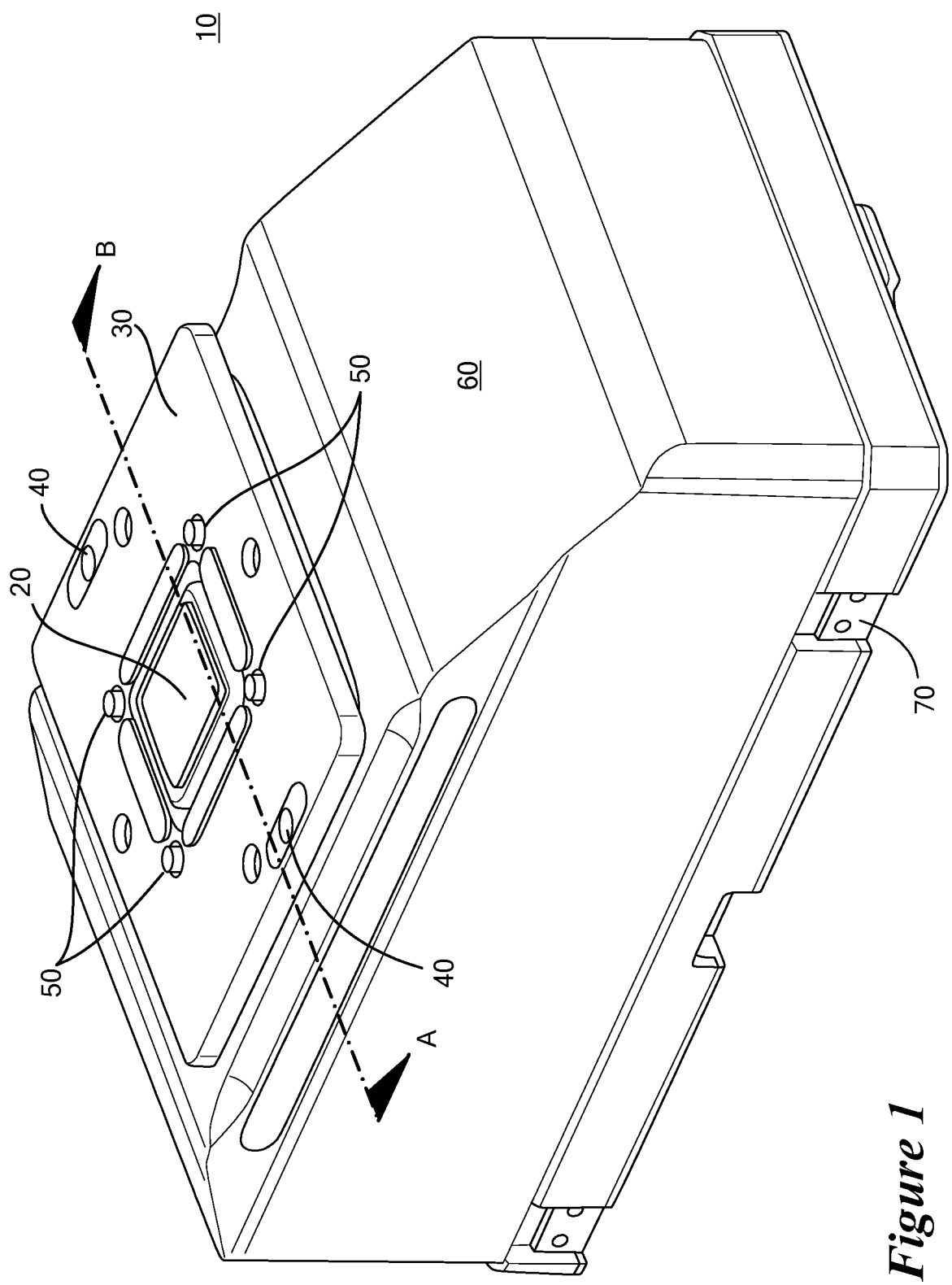
FIG. 1 is a perspective view of the test head assembly according to the present disclosure.

Referring initially to FIG. 1, a semiconductor test head assembly 10, having a base assembly 70 and an enclosure assembly 60, is illustrated. The test head assembly 10, has at least one temperature control unit 20 and at least one DUT press plate 30. A plurality of press plate alignment features 40 are constructed and arranged to cooperate with DUT press plate 30. Attached to DUT press plate 30 is a plurality of attachment devices, for example, a plurality of suction cups 50 constructed and arranged for attachment to a DUT.

Figure 10:
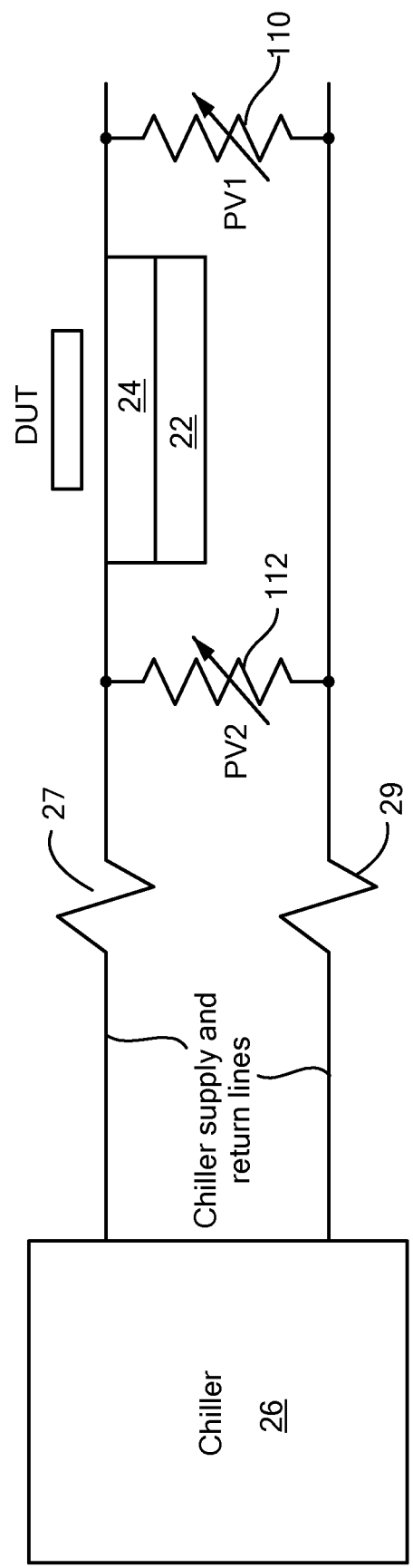
FIG. 10 is a schematic drawing of the flow control approach of the temperature control unit.

The at least one temperature control unit 20 is constructed and arranged to heat to a predetermined set point temperature before the start of a test. Additionally, the at least one temperature control unit 20 is constructed and arranged to provide cooling or heating to maintain the DUT temperature at the set point during operation, as may be required (typically 85-120° C.). The at least one temperature control unit 20 is further comprised of a heater element 22 attached to a cold plate, i.e, heat sink assembly 24 in the present embodiment. During testing, the heat sink assembly 24 is positioned for direct contact with the DUT. The heat sink assembly 24 is fluidly coupled to a chiller 26 with supply and return lines. In one embodiment, as illustrated in FIG. 10, parallel flow paths are achieved by having a first control valve 110 fluidly connecting the chiller supply line to the chiller return line in series installed on the discharge side of cold plate assembly 24, however the first control valve could be fluidly connected in series on the inlet side of the cold plate assembly, and a second control valve 112 fluidly connecting the chiller supply line to the chiller return line in parallel installed on the intake side of the heat sink assembly 24. The second control valve 112 acts as a bypass valve by diverting some of the flow away from the heat sink 24 when needed. In one embodiment, the second control valve 112 can be an automatic backpressure regulator that maintains a constant pressure at the inlet of the temperature control unit. The valves can be operated in a complimentary manner to keep the flow rate in the main supply and return lines substantially constant. This allows changing the flow rate through the heat sink without needing to accelerate or decelerate the fluid in the supply line and return line, thereby increasing the rate at which the flow can be changed. Moreover, by temporarily over or under driving the bypass valve, the inertia in the supply and return lines may be used to change the pressure drop across the heat sink so as to further increase the rate at which the flow rate can be changed.

In order to keep the flow rate in the main supply and return lines substantially constant, the flow rate should be close to or less than thermal time constant of the system. Thermal control systems can be characterized based on thermal time constants, which are related to the product of thermal capacitance and thermal resistance. Time constants can be calculated for various operating conditions and for various subsets of interconnected components. The intent of this flow control topology is to reduce the time needed to adjust the flow rate through the cold plate to be small compared the relevant thermal time constants of the system. For example, in one simplified model, the copper body of the microchannel cold plate is considered as a single lumped capacitance with temperature that can vary in time but is spatially uniform. The cold plate provides a thermal resistance between the average copper temperature and coolant inlet temperature of $0.029°$ C./W. The thermal capacity of the copper cold plate in this example is $3.29$ J/° C. Multiplying these values together derives a thermal time constant of $0.095$ seconds, as shown below. In order to keep the flow rate in the main supply and return lines substantially constant the flow rate should be close to or less than the $0.095$ seconds.

| | |
|---|---|
| Cold plate thermal resistance | 0.029° C./W |
| Cold plate impedance | .15 C-cm$^2$/W |
| Cold plate area | 5.175 cm$^2$ |
| Cold plate thermal capacity | 3.29 J/° C. |
| Copper cold plate volume | 9.57E–07 m$^3$ |
| Cold plate area | 5.175 |
| Cold plate thickness | 3.7 |
| Cold plate void fraction | 0.5 |
| Copper specific heat | 384 J/kg-K |
| Copper density | 8960 kg/m$^3$ |
| Cold plate thermal time constant | 0.095 seconds |

In the present application, the valves that are utilized take approximately 0.030 seconds to close, which is selected to be less than the cold plate thermal time constant. This rapid closing time is possible due to the utilization of a bypass valve which allows the flow rate in the main supply lines to remain substantially constant, minimizing effects of pressure surge from momentum change.

Figure 2:
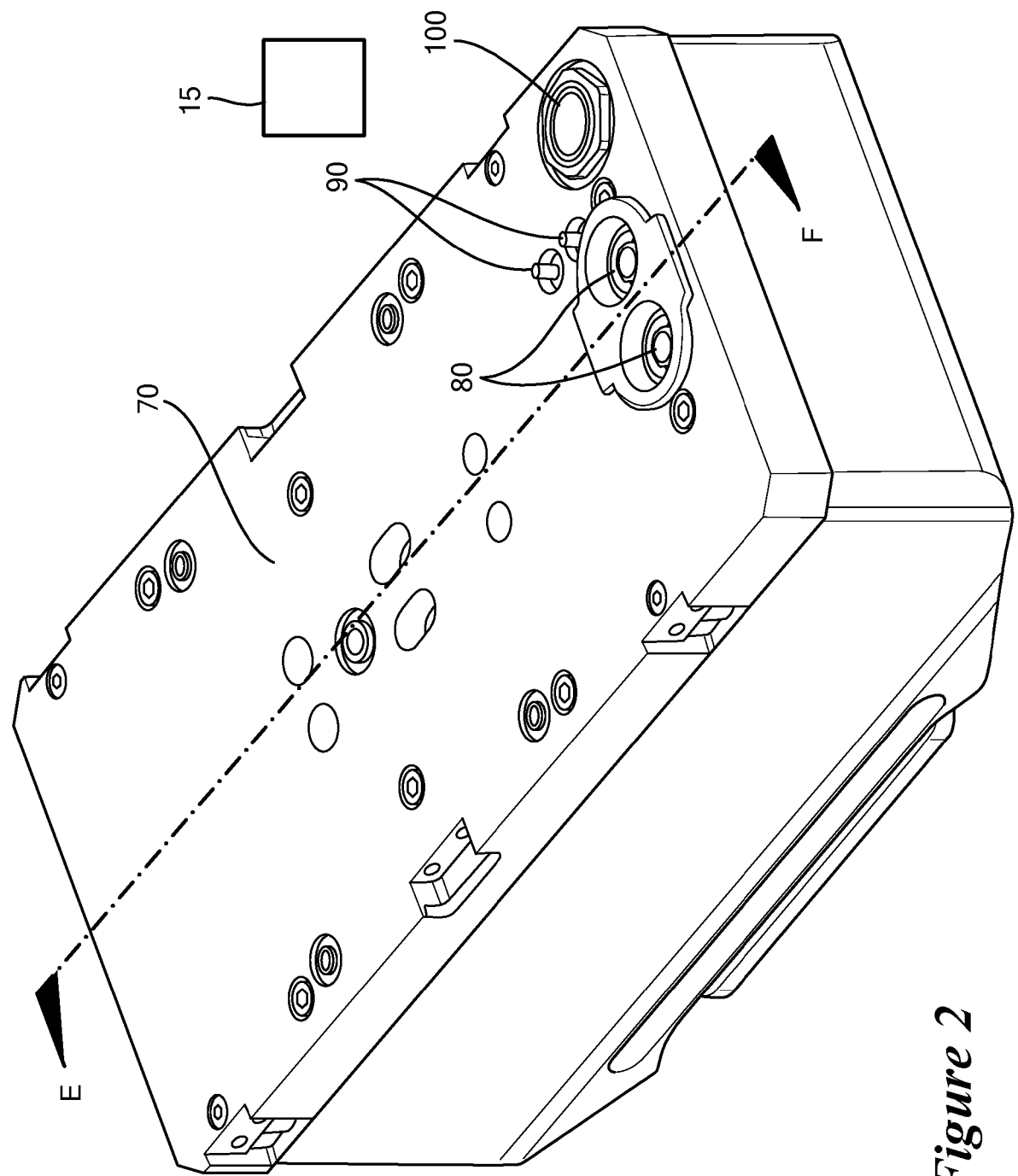
FIG. 2 is a bottom perspective view of the test head assembly of FIG. 1.

The base assembly 70, as depicted in FIG. 2, includes a manifold assembly fluidly connected to the heat sink coolant supply and return lines. In one non-limiting embodiment, the manifold assembly 80 is configured for attachment with quick disconnect fittings. The base assembly 70 has at least one aperture 90 for attachment of a compressed air supply for operation of the actuator assembly. The at least one aperture 90 is configured for use with quick disconnect fittings in the exemplary embodiment. Additionally, an electrical connector 100 may be included for connection of the test device 10 to a control unit 15 that provides power to the heater and records heater temperature, coolant supply and return temperatures, and heat sink pressure drop. Support leg flexure assembly plate 120 and 122 may be included for structural support, as needed.

Figure 3:
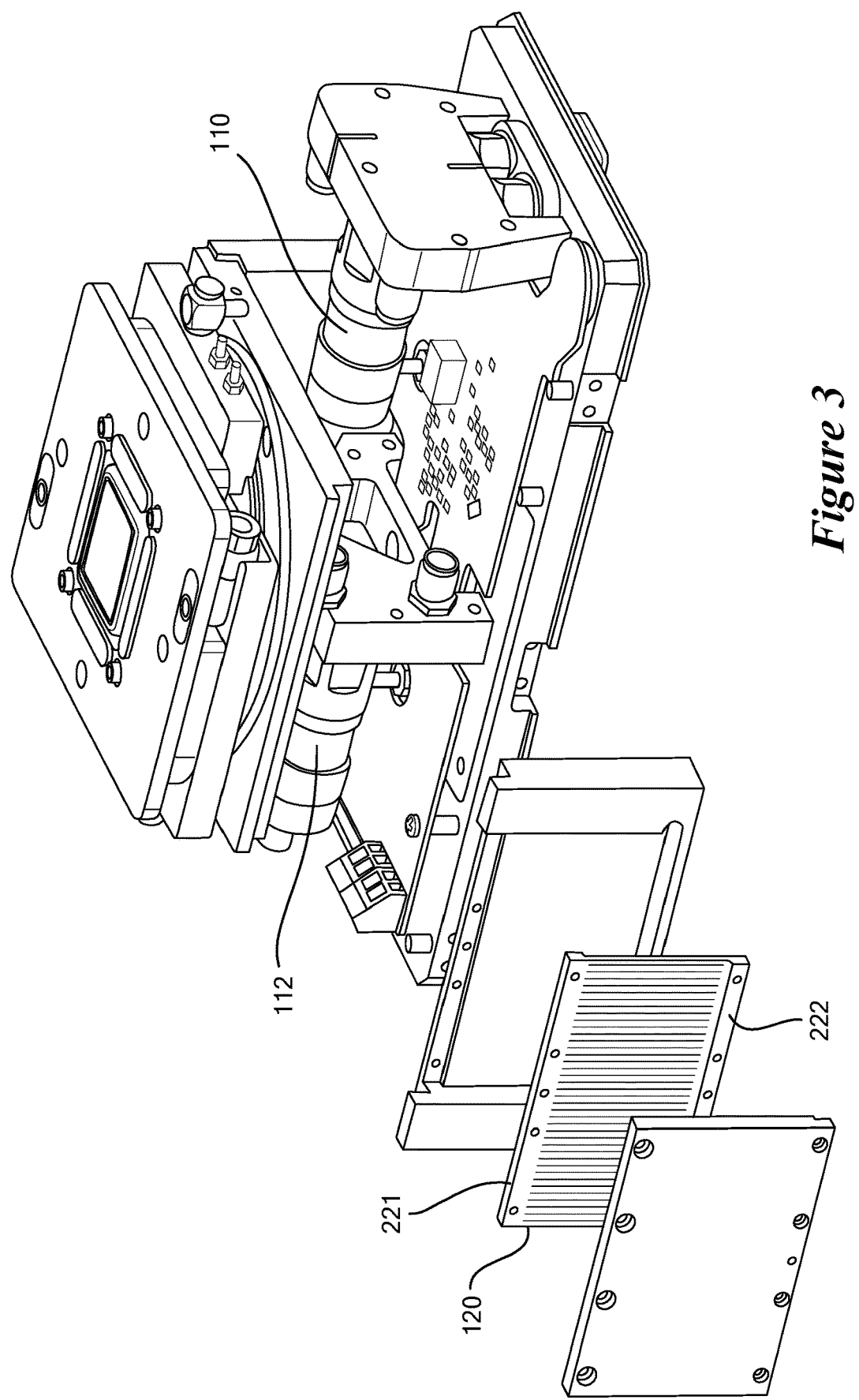
FIG. 3 is an exploded perspective view of the test head assembly of FIG. 1.
Figure 4:
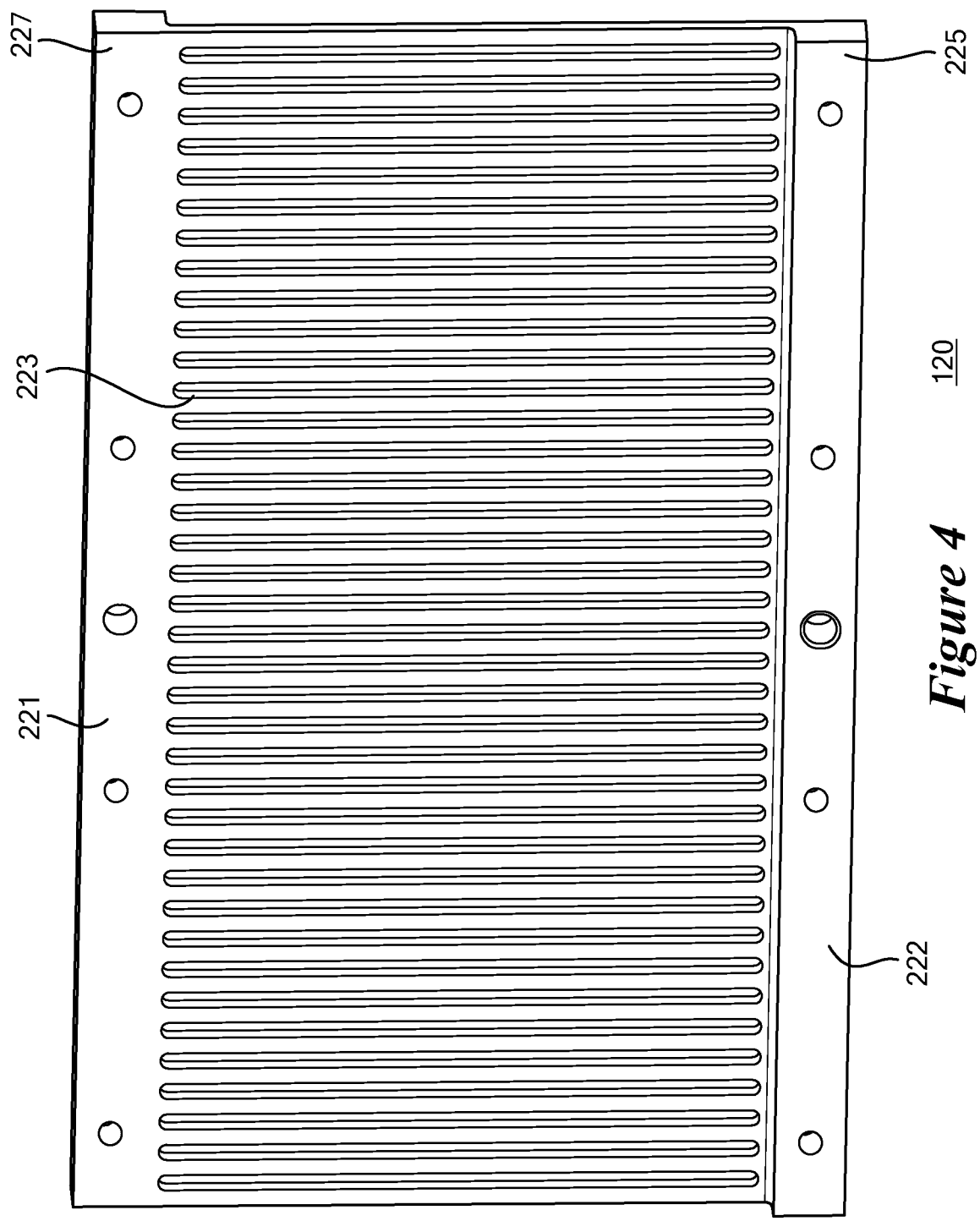
FIG. 4 is a front perspective view of a support leg flexure assembly.
Figure 5:
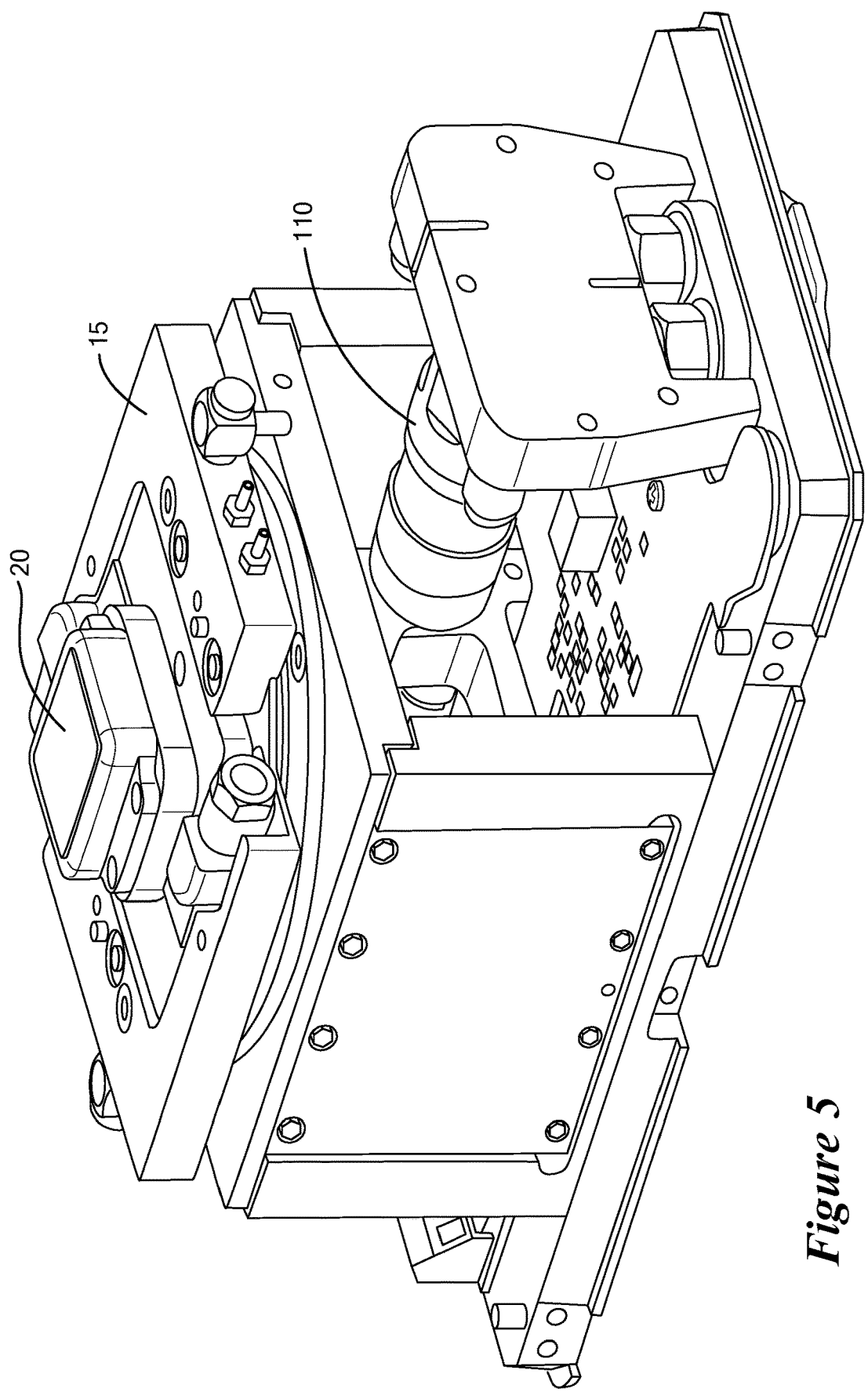
FIG. 5 is a perspective view of the test head assembly of FIG. 1 with the enclosure removed.

In one embodiment, as depicted in FIG. 3, the present device is shown having at least two proportional electrically actuated flow control valves. A first electrically actuated control valve 110 is fluidly connecting the chiller supply line 27 to the chiller return line 29 installed on the discharge side of heat sink assembly 24, and a second electrically actuated control valve 112 is fluidly connecting the chiller supply line 27 to the heat sink inlet. A separate tube may be used to connect the heat sink discharge to the chiller return line. The temperature of the DUT is controlled by simultaneously varying the flow through the heat sink assembly 24 and the power to the heater element 22.

The test head assembly 10 has at least one support leg flexure 120 having a top section 221 and a bottom section 222. Segmented flexures may be formed by a plurality of ribs 223 connecting the top section 221 to the bottom section 222 of the support leg flexure at a predetermined length. In one embodiment, the support leg flexure 120 is formed as a unitary piece, in another it is formed from multiple pieces. The at least one support leg flexure 120 also includes a proximal end 225 and a distal end 227. The proximal end 225 is fixedly attached to the base assembly 70 and the distal end 227 is fixedly attached to a press plate actuator cylinder 160. A second support leg fixture 122 has a proximate end 226 and a distal end 228. On the opposing side of press plate actuator cylinder 160 the distal end 228 of support leg fixture 122 is attached and the proximate end 228 of support leg fixture 122 is attached to the base assembly 70 as depicted in the figures.

Figure 6:
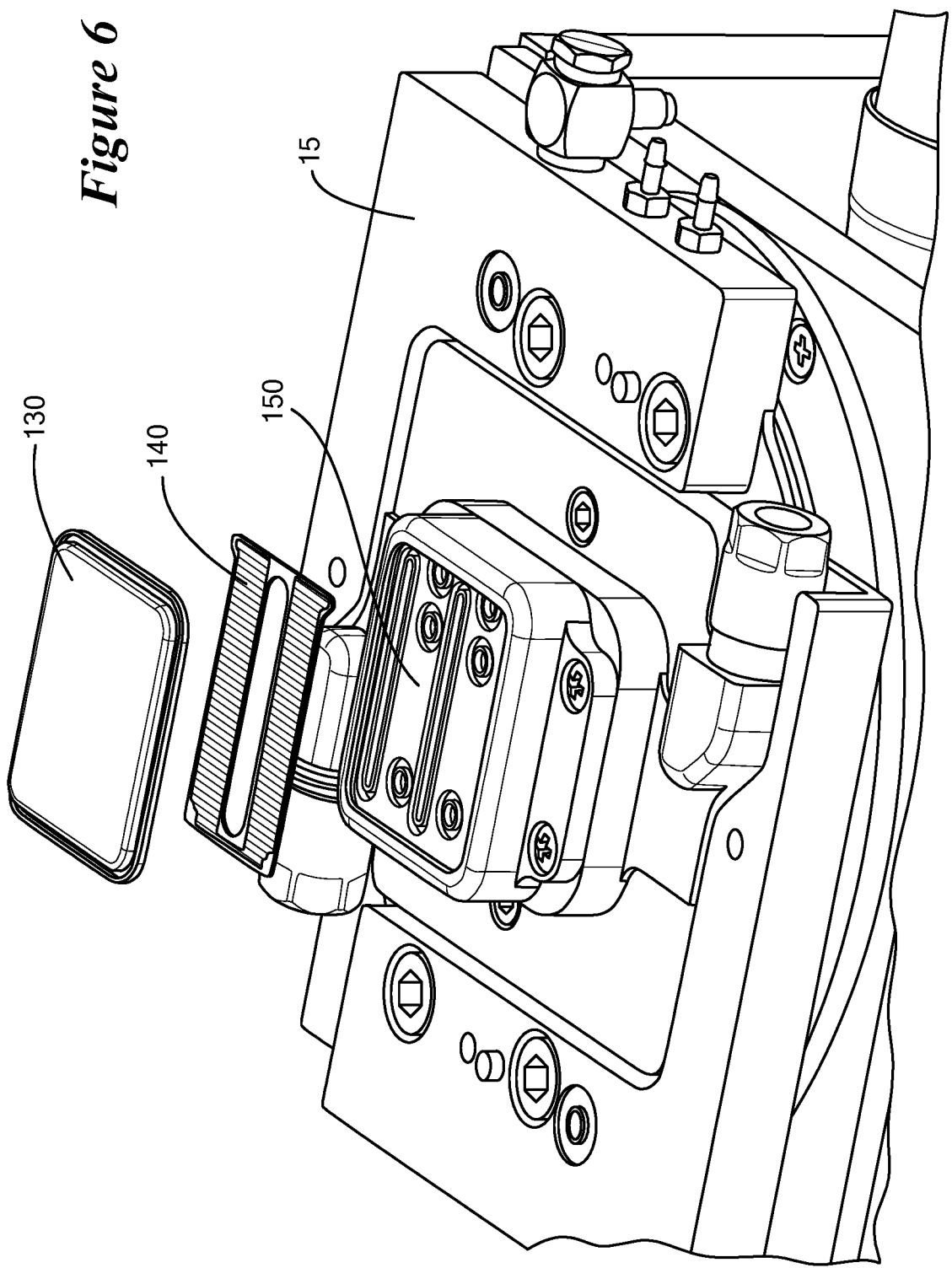
FIG. 6 is an exploded view of the temperature control unit of the test head assembly of FIG. 1.
Figure 7:
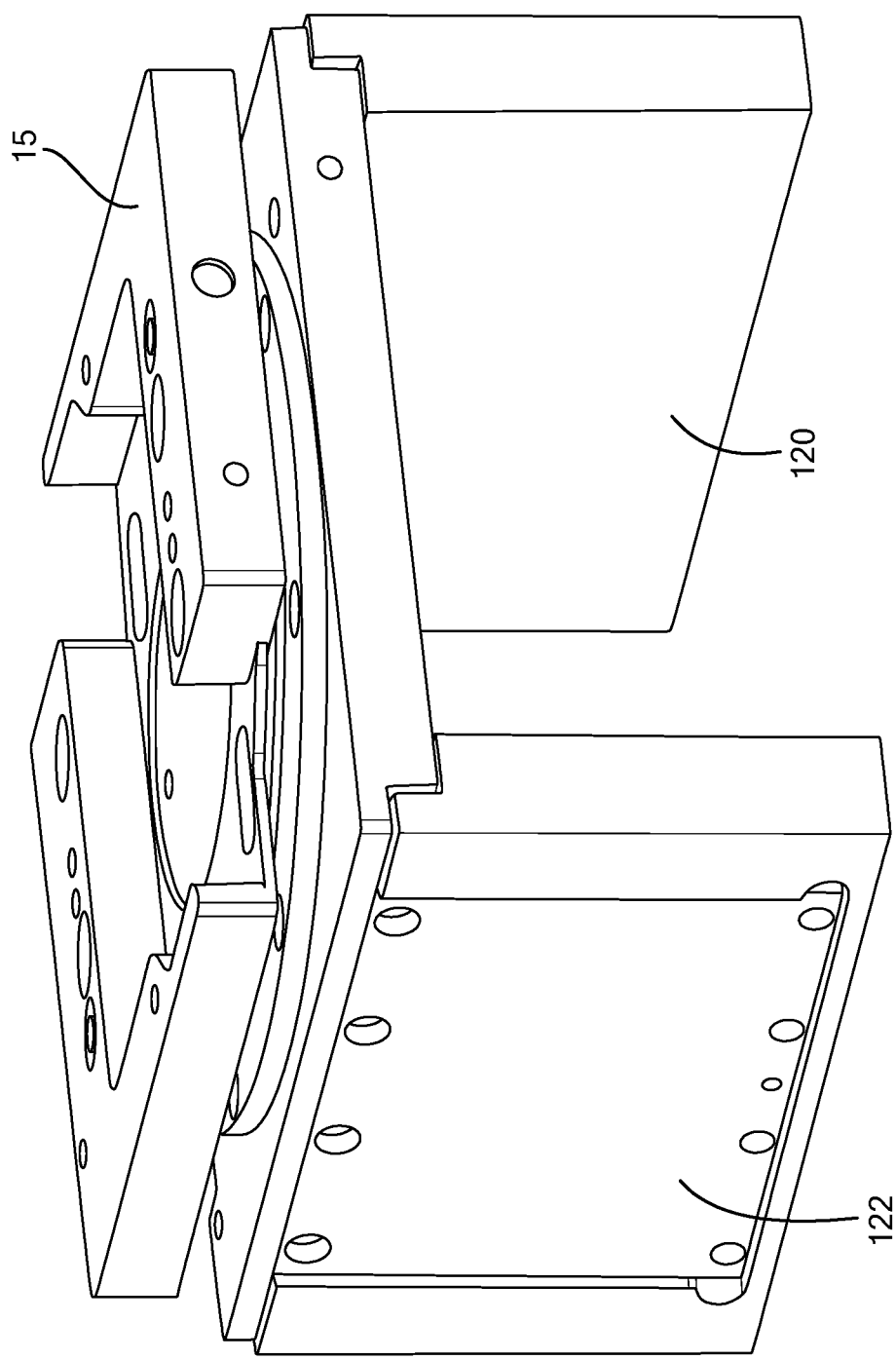
FIG. 7 is a perspective view of the semiconductor test head actuator of the test head assembly of FIG. 1.
Figure 8:
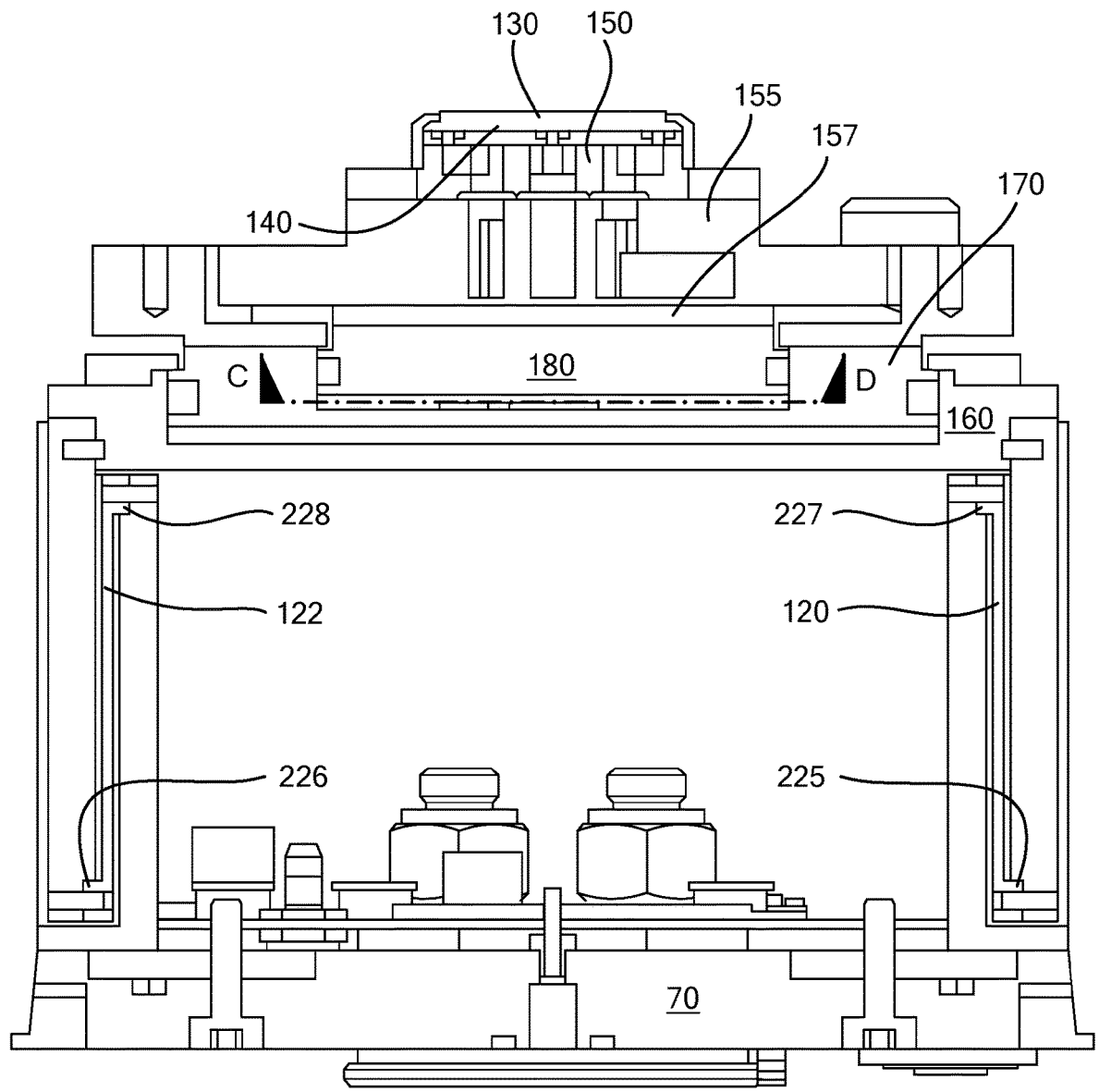
FIG. 8 is a section view of the test head assembly of FIG. 1 taken along line A-B of FIG. 1.

Temperature control unit 20, as illustrated in FIG. 6, is further comprised of a microchannel cold plate 130, attached to a thin film heater 140 which is attached to a cold plate manifold 150. The cold plate manifold 150 is attached to the cold plate header 155 which is attached to the temperature control unit actuator piston 180 through a thermal isolation plate 157. The cold plate manifold 150 and the thermal isolation plate 157 are fabricated from low thermal conductivity material such as a fiber reinforced polymer, or other suitable materials with low thermal conductivity. The piston assembly 180 (FIGS. 8, 9) is configured for extension and retraction of the temperature control unit 20.

Figure 9:
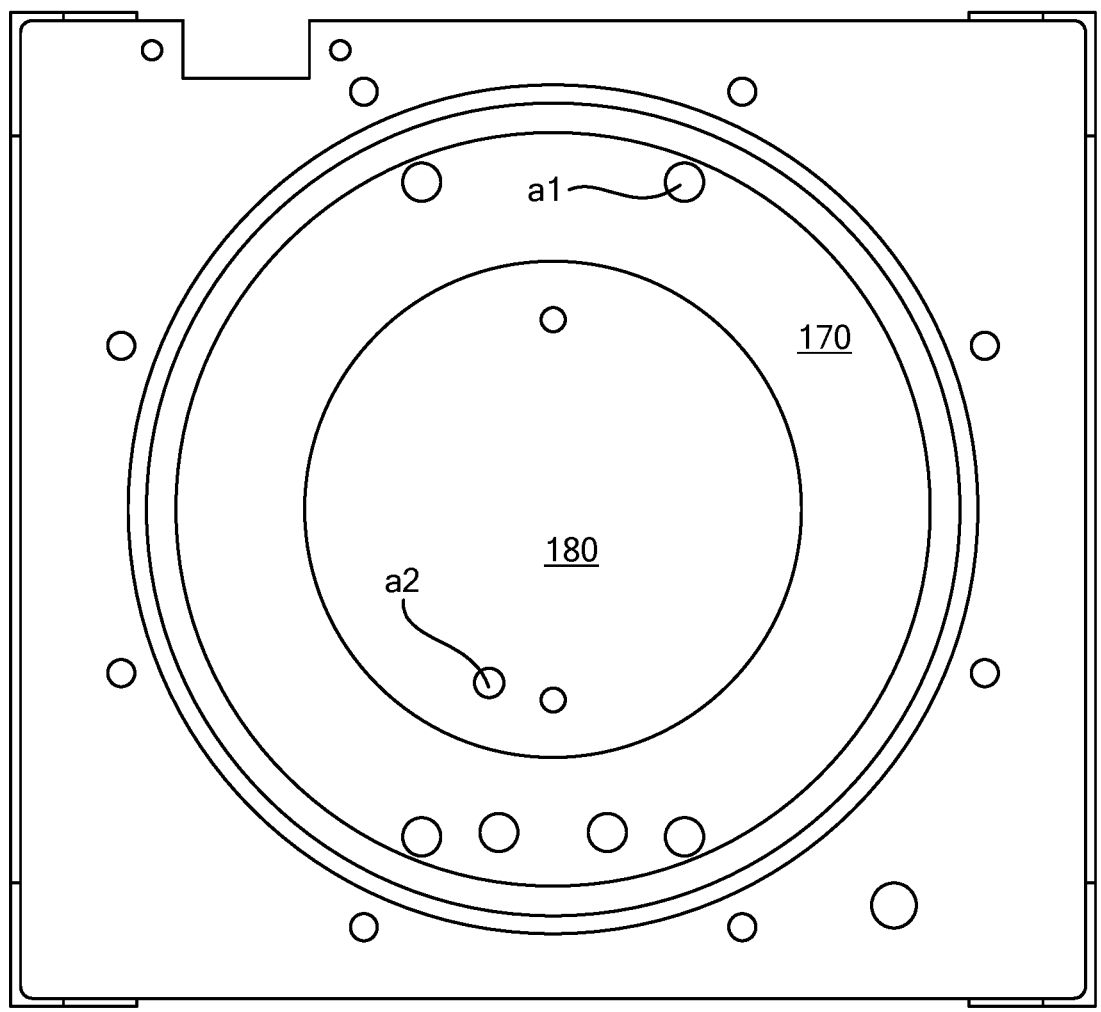
FIG. 9 is a section view of the actuator pistons taken along line C-D of FIG. 8.

Support leg fixture 120 and 122 are connected to the cylinder of press plate actuator 160 to provide X axis, Y axis and yaw compliance. Press plate actuator 160 is constructed and arranged to cooperate with an actuator piston assembly 170. The press plate 30 may be mounted directly upon actuator piston assembly 170 if desired. In one embodiment, as depicted in FIG. 9, actuator piston assembly 170 has a spherical piston constructed and arranged to provide Z axis and primary roll and tilt compliance. As illustrated, the surface of piston assembly 170 may include a plurality of apertures "a1". Piston assembly 180 has a spherical piston constructed and arranged to provide Z axis motion and secondary roll and tilt compliance. The piston assembly surface 180 may also be comprised of a plurality of apertures "a2". The plurality of apertures "a1" and "a2" are ports constructed and arranged for supplying pressurized air to the cylinders of the cylinders in the piston assemblies.

Figure 11:
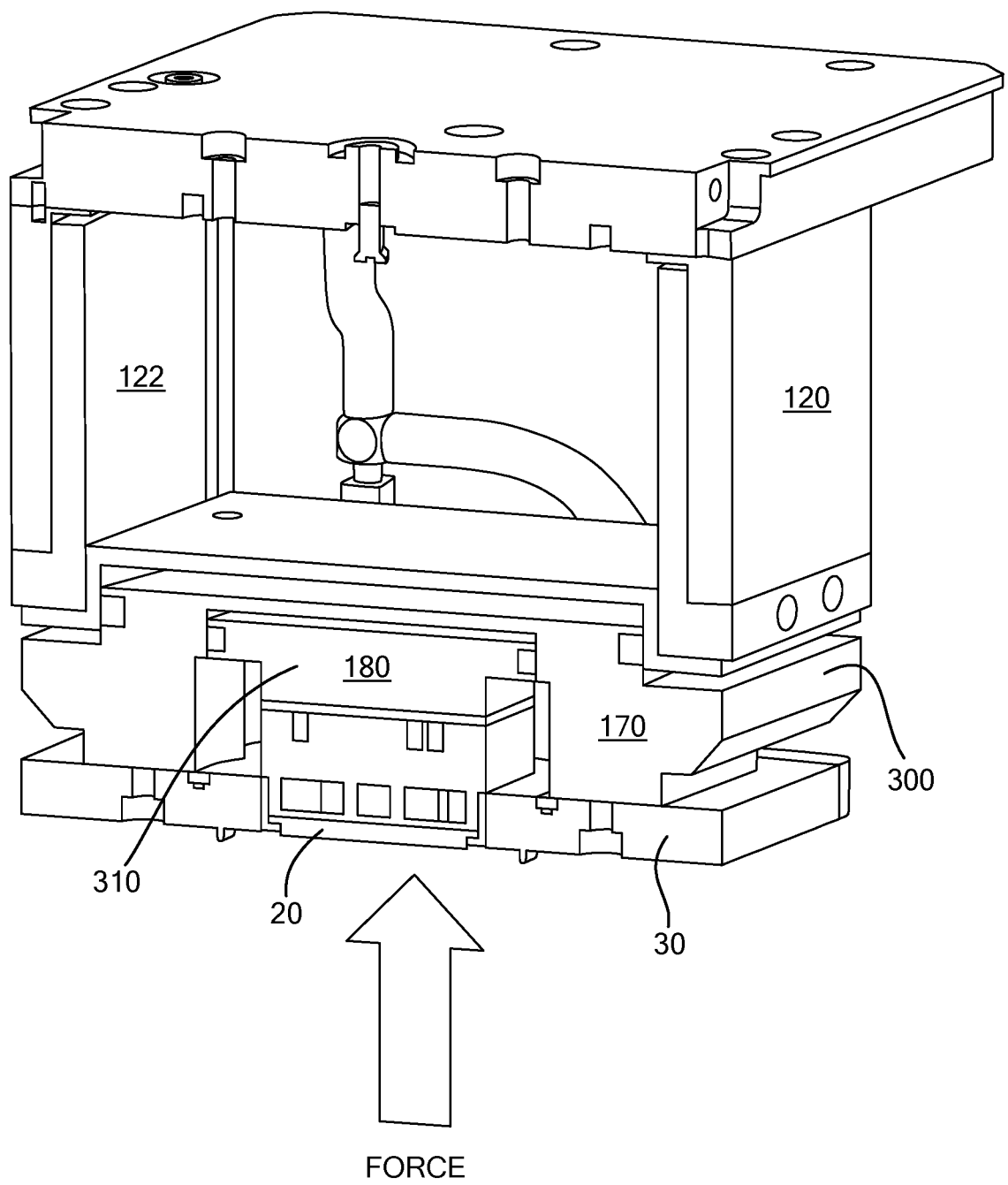
FIG. 11 is an section view of the mechanical actuator design taken along line E-F of FIG. 2.

In one embodiment as illustrated in FIG. 11, the actuator design has two nested pneumatic actuators, an outer actuator 300 and an inner actuator 310. The cylinder of the outer actuator is mounted to the handler arm through an array of flexures that provide X, Y and jaw compliance. The package press plate 30 is mounted on the piston 170 of the outer actuator 300 and the air pressure in the outer actuator is controlled to apply the desired socketing force. The piston edges are shaped to provide enough clearance between the cylinder and piston walls to allow several degrees of angular compliance (roll and tilt) to accommodate the out of parallelism tolerance between the testing head and the socket. The cylinder of the inner actuator 310 is also mounted to the piston of the outer actuator 300. The temperature control unit is mounted to the piston of the inner actuator and the air pressure in the inner actuator is controlled to apply the desired load to the interface between the temperature control unit and the DUT die or lid. The inner piston edges are also shaped to provide enough clearance between the cylinder and piston walls to allow several degrees of angular compliance (roll and tilt) to accommodate the out of parallelism tolerance between the DUT die or lid and the package rim. Both the outer and inner pistons are non-circular in shape to prevent rotation and translation of the press plate and the temperature control unit. In one embodiment, the temperature control unit is microchannel cold plate with geometries similar to those described in previous patent applications filed by the Applicant.

In one exemplary embodiment, a test sequence is performed with the following method: The test head is moved over a tray holding the electronic components that need testing (DUTs) and one component is picked up and held against the temperature control unit 20 using a plurality of suction cups 50. The test head is then moved over the testing socket and is lowered to the testing position. Alignment pins or other suitable alignment mechanisms, know to one of skill in the art, are inserted in the socket and guide the insertion of the DUT into the socket. The flexures 120, 122 supporting the actuators provide the x, y, and jaw compliance and proper alignment of the test head and the socket. In the testing position, both z actuators are in their mid-range of their travel. The outer actuator 300 applies socketing force to the rim of the DUT package and the inner actuator 310 presses the temperature control unit against the heat generating area of the DUT. The roll and tilt motion of the actuators provide the compliance for proper alignment between the press plate and rim of the DUT package and between the temperature control unit 20 and the heat generating area of the DUT. Prior to initiating the test, the DUT temperature is raised to the set point by applying power to the heater. The DUT temperature is then maintained at the setpoint by servo controlling the flow of coolant through temperature control unit to provide sufficient cooling to balance the power applied to the heater. During testing, the power of the DUT is varied in a prescribed pattern and the flow through the temperature control unit 20 and the power to the heater are servo controlled to maintain the DUT temperature at the predetermined set point.

Having thus described several aspects of at least one disclosed example, it is to be appreciated that various alterations, modifications, and improvements will readily occur to those skilled in the art, without departing from the spirit and scope of the invention as defined by the appended claims. Therefore, the claims are not to be limited to the specific example(s) depicted herein. For example, the features of one example disclosed above can be used with the features of another example. Furthermore, various modifications and rearrangements of the parts may be made without departing from the spirit and scope of the underlying inventive concept. Such alterations, modifications, and improvements are intended to be part of this disclosure and are intended to be within the scope of the examples discussed herein. Thus, the details of these components as set forth in the above-described examples should not limit the scope of the claims.

Further, the purpose of the Abstract is to enable the U.S. Patent and Trademark Office, and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the claims of the application nor is intended to be limiting on the claims in any way.

What is claimed is:

1. A thermal test head assembly comprising:
   a base assembly, including a manifold assembly constructed and arranged for attachment of coolant supply and return lines, and at least one aperture for attachment of a compressed air supply,
   at least one temperature control unit,
   at least one piston actuator assembly,
   at least one Device Under Testing (DUD press plate connected to said piston actuator,
   a plurality of alignment features constructed and arranged to cooperate with said DUT press plate, and a plurality of fasteners constructed and arranged for attachment to a device under testing,
   at least two flow control valves, comprising a first flow control valve installed fluidically in series with the temperature control unit and a second flow control valve installed fluidically in parallel with temperature control unit, and
   wherein the first flow control valve and the second control valve are operational to keep the fluid inertia in the inlet and discharge sides constant during testing to affect rapid changes in the flow rate through the temperature control unit to maintain said DUT temperature at a predetermined set point during the testing.

2. The thermal test head assembly of claim 1, wherein said piston actuator comprises a pair of nested pneumatic actuators mounted on a flexure assembly constructed and arranged to provide compliance along directions perpendicular to the actuator axis of motion to provide mechanical alignment between the temperature control unit and the DUT.

3. The thermal test head assembly of claim 1, wherein said at least one temperature control unit further comprised of a microchannel cold plate, a thin film heater, and a cold plate manifold having an inlet port and discharge port.

4. The thermal test head assembly of claim 3, wherein said microchannel cold plate is attached to said thin film heater, which is attached to said cold plate manifold.

5. The thermal test head assembly of claim 1, wherein said first flow control valve and said second flow control valve are proportional electrically actuated control valves.

6. The thermal test head assembly of claim 1, wherein said temperature control unit is constructed and arranged to be capable of heating to a predetermined set point temperature.

7. The thermal test head assembly of claim 1, wherein said temperature control unit is constructed and arranged to provide cooling or heating to maintain the DUT set point temperature during operation.

8. The thermal test head assembly of claim 1, wherein said cold plate manifold is mounted on a cold plate header.

9. The thermal test head assembly of claim 1, wherein said piston actuator assembly further comprises a first piston assembly comprised of a piston and cylinder configured for extension and retraction of said temperature control unit, and a second piston assembly comprised of a piston and cylinder configured for operation of said DUT press plate.

10. The thermal test head assembly of claim 9, wherein said first piston assembly has a translational and rotational piston constructed and arranged to provide Z axis motion and secondary roll and tilt compliance, and said second piston assembly has a translational and rotational piston constructed and arranged to provide Z axis motion and primary roll and tilt compliance.

11. The thermal test head assembly of claim 9, wherein said first piston assembly and said second piston assembly are pneumatically operated.

12. The thermal test head assembly of claim 2, wherein said flexure assembly plate is a segmented support leg flexure.

13. A thermal test head assembly comprising:
a liquid cooled microchannel cold plate assembly thermally coupled to an electrical device under test, having a coolant inlet port and a coolant outlet port,
at least one chiller fluidly connected to supply coolant to said microchannel cold plate,
an inlet tube supplying coolant from said chiller to said inlet port,
an outlet tube returning coolant from said outlet port to said chiller,
a first control valve fluidically connected in series with said microchannel cold plate,
a second control valve fluidically connected in parallel with said microchannel cold plate and configured for bypass flow control,
a control unit constructed and arranged to actuate said first control valve and said second control valve to maintain the temperature of said electrical device under testing at a predetermined set point,
a first pneumatic actuator having a piston assembly and a second pneumatic actuator having a piston assembly,
wherein said first control valve and said second control valve are connected in close proximity to said cold plate and constructed and arranged to control flow through said first and second control valves to keep the temperature of said electronic device under testing at the desired setpoint as the power dissipation of the electronic device under testing varies during the test.

14. The thermal test head assembly of claim 13, wherein the flow through said second control valve is adjusted so the flow in said inlet and outlet tubes remains constant as the flow through said microchannel cold plate assembly is adjusted to keep the electronic device under testing at the desired set point.

15. The thermal test head assembly of claim 13, wherein said first pneumatic actuator piston assembly is attached to said microchannel cold plate assembly, constructed and arranged so said first piston assembly can rotate around the two axes perpendicular to the direction of travel thereby aligning the surfaces of the micro channel cold plate assembly to that of said electronic device under testing.

16. The thermal test head assembly of claim 13, wherein said first pneumatic actuator is embedded in said second pneumatic actuator piston assembly and said second piston of said second pneumatic actuator assembly can rotate around the two axes perpendicular to the direction of travel thereby aligning the contact faces of said press plate and said electrical device under testing.

17. The thermal test head assembly of claim 15, wherein said first pneumatic actuator is mounted on flexures that provide compliance along a direction perpendicular to the direction of travel.

18. The thermal test head assembly of claim 16, wherein said second actuator is mounted on flexures that provide compliance along a direction perpendicular to the direction of travel.

19. The thermal test head assembly of claim 13, where said second control valve fluidically connected in parallel with the temperature control unit is a backpressure regulator that maintains the constant the pressure at the inlet to the temperature control unit.

\* \* \* \* \*